(12) United States Patent
Song et al.

(10) Patent No.: US 11,575,348 B1
(45) Date of Patent: Feb. 7, 2023

(54) PHONONIC COMB ENHANCED CAPACITIVE INDUCTIVE SENSOR

(71) Applicant: HRL Laboratories, LLC, Malibu, CA (US)

(72) Inventors: Hyok J. Song, Oak Park, CA (US); Walter S. Wall, Calabasas, CA (US); Randall L. Kubena, Oak Park, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/347,403

(22) Filed: Jun. 14, 2021

Related U.S. Application Data

(60) Provisional application No. 63/070,522, filed on Aug. 26, 2020.

(51) Int. Cl.
*H03B 5/08* (2006.01)
*H03K 5/26* (2006.01)
*G01D 5/24* (2006.01)
*G01D 5/20* (2006.01)

(52) U.S. Cl.
CPC ............. *H03B 5/08* (2013.01); *G01D 5/20* (2013.01); *G01D 5/24* (2013.01); *H03K 5/26* (2013.01)

(58) Field of Classification Search
None
See application file for complete search history.

(56) References Cited

U.S. PATENT DOCUMENTS

| 4,132,964 A | 1/1979 | Wilcox |
| 7,750,535 B2 | 7/2010 | Kubena |
| 7,851,971 B2 | 12/2010 | Chang |

(Continued)

FOREIGN PATENT DOCUMENTS

| EP | WO2019094509 A1 * | 5/2019 | ............... H03L 7/20 |
| KR | 10-2012-0132987 A | 12/2012 | |

(Continued)

OTHER PUBLICATIONS

URL: https://en.wikipedia.org/wiki/Capacitive_sensing.

(Continued)

*Primary Examiner* — Giovanni Astacio-Oquendo
*Assistant Examiner* — Dilara Sultana
(74) *Attorney, Agent, or Firm* — Ladas & Parry, LLP

(57) ABSTRACT

A method and apparatus for enhancing the sensitivity of an oscillator circuit functioning, in use, to sense changes in the inductance of inductive elements and/or the capacitance of capacitive elements coupled to said oscillator circuit. The oscillator circuit is coupled to a nonlinear resonator for generating a comb of frequencies in response to a drive frequency generated by the oscillator circuit, the comb of frequencies having at least a portion of at least one tooth for which an absolute value of the first derivative of the drive frequency with respect to said comb frequency is less than 1.0, comparing an output of the nonlinear resonator with an output of a reference oscillator for detecting changes in the drive signal of the oscillator circuit as enhanced by the slope of the at least a portion of at least one tooth for which the absolute value of the first derivative of the drive frequency with respect to said comb frequency is less than 1.0.

11 Claims, 10 Drawing Sheets

(56) References Cited

U.S. PATENT DOCUMENTS

| | | | |
|---|---|---|---|
| 8,601,607 | B2 | 12/2013 | Hagmann |
| 8,765,615 | B1 | 7/2014 | Chang |
| 8,994,465 | B1 | 3/2015 | Kubena |
| 10,110,198 | B1 | 10/2018 | Kubena |
| 10,389,392 | B1 | 8/2019 | Kubena |
| 10,819,276 | B1 | 10/2020 | Kubena |
| 2010/0321117 | A1 | 12/2010 | Gan |
| 2018/0157148 | A1 | 6/2018 | Kim |
| 2019/0250198 | A1 | 8/2019 | Kubena |
| 2020/0158769 | A1 | 5/2020 | Liu |
| 2021/0091748 | A1 | 3/2021 | Kubena |

FOREIGN PATENT DOCUMENTS

| | | |
|---|---|---|
| KR | 10-2008-0044977 A | 5/2018 |
| WO | 2014-018444 A2 | 1/2014 |
| WO | 2019/217668 A1 | 11/2019 |

OTHER PUBLICATIONS

Ganesan, Adarsh, Cuong Do, and Ashwin Seshia. "Excitation of coupled phononic frequency combs via two-mode parametric three-wave mixing," Physical Review B 97.1 (2018): 014302.

Park, Mingyo, and Azadeh Ansari. "Phononic frequency combs in stand-alone piezoelectric resonators." 2018 IEEE International Frequency Control Symposium (IFCS). IEEE, 2018.

Ganesan, A., Seshia, A. and Gorman, J. (2020), "Phononic Frequency Combs For Engineering MEMS/NEMS Devices With Tunable Sensitivity," IEEE SENSORS 2019.

U.S. Appl. No. 16/932,431, filed Jul. 17, 2020, Kubena.
U.S. Appl. No. 16/932,447, filed Jul. 17, 2020, Kubena.
U.S. Appl. No. 16/932,455, filed Jul. 17, 2020, Kubena.
U.S. Appl. No. 17/348,344, filed Jun. 15, 2021, Kubena.
U.S. Appl. No. 15/965,652, filed Apr. 27, 2018, Kubena.
U.S. Appl. No. 16/512,091, filed Jul. 15, 2019, Sorenson.
U.S. Appl. No. 16/775,242, filed Jan. 28, 2020, Kubena.
U.S. Appl. No. 16/932,427, filed Jul. 17, 2020, Kubena.
PCT International Search Report and Written Opinion from PCT/US2020/051863 dated Jan. 4, 2021.
From U.S. Appl. No. 16/932,455 (now published as US 2021-0091748), office action dated Apr. 22, 2021.
From U.S. Appl. No. 16/932,455 (now published as US 2021-0091748), Notice of Allowance dated Jun. 23, 2021.
Askari, S. et al., "Near-Navigation Grade Quad Mass Gyroscope With Q-Factor Limited By Thermo-Elastic Damping," Solid-State, Actuators, and Microsystems Workshop Technical Digest, Hilton Head, South Carolina, USA, 2016, pp. 254-257.
Bennett, S. P. et al., "Magnetic Field Response of Doubly Clamped Magnetoelectric Microelectromechanical AlN-FeCo Resonators," Applied Physics Letters 111, 252903 (2017).
Bhatia, A. et al., "Linearization of Phase-Modulated Analog Optical Links using a Four-Wave Mixing Comb Source," Optics Express, DOI: 10.1364/OE 22.030899, Dec. 4, 2014.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A. et al., "Phononic Frequency Comb via Intrinsic Three-Way Mixing," Physical Review Letters, PRL 118, 033903 (2017), (5 pages).
Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Sheng, et al., "A Microfabricated Optically-Pumped Magnetic Gradiometer," Applied Physics Letters 110, 031106 (2017).
Veryaskin, A. "Gravity, Magnetic and Electromagnetic Gradiometry: Strategic Technologies in the 21st century ", IOP ebooks, 2018 (57 pages).
Vrba, J., "SQUID Sensors: Fundamentals, Fabrication and Applications," edited by H. Weinstock, Kluwer Academic, Dordrecht, The Netherlands, 1996, p. 117.
Wall, Walter S., et al., "Phase Noise Transfer in High-Q Quartz Phononic Frequency Combs," IEEE, 2020 (4 pages).
Wang, S. et al., "A MEMS Resonant Accelerometer for Low-Frequency Vibration Detection," Sensors and Actuators A: Physical, 283, Nov. 2018, pp. 151-158.
WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.
Yao, et al., "Bulk Acoustic Wave-Mediated Multiferroic Antennas: Architecture and Performance Bound," IEEE Transactions on Antennas and Propagation, vol. 63, No. 8, Aug. 2015.
Zhai, J.., et. al., "Detection of Pico-Tesla Magnetic Fields using Magneto-Electric Sensors at Room Temperature," Applied Physics Letters, 88, 062510 (2006).
URL: https://en.wikipedia.org/wiki/Capacitive_sensing (page was last edited on May 10, 2021 at 08:25 (UTC)).
PCT International Preliminary Report on Patentability (Chapter I) with Written Opinion from PCT/US2020/051863 dated Apr. 7, 2022.

* cited by examiner

US 11,575,348 B1

PHONONIC COMB ENHANCED CAPACITIVE INDUCTIVE SENSOR

CROSS REFERENCE TO RELATED APPLICATIONS

This application claims the benefit of U.S. Provisional Patent Application Ser. No. 63/070,522, filed 26 Aug. 2020 and entitled "A Phononic Comb Enhanced Capacitive Inductive Sensor", the disclosure of which is hereby incorporated herein by reference.

This application is related to the technology disclosed in U.S. Provisional Patent Application Ser. No. 62/881,069, filed 31 Jul. 2019 and entitled "Phononic Comb Enhanced Gradiometers" and its corresponding non-Provisional U.S. patent application Ser. No. 16/932,431, filed 17 Jul. 2020 and having the same title as its related provisional application and filed on the same date as this application, the disclosures of which are hereby incorporated herein by reference.

This application is also related to the technology disclosed in U.S. Provisional Patent Application Ser. No. 62/890,799, filed 23 Aug. 2019 and entitled "Phononic Comb Enhanced MEMS Gravity Gradiometer" and its corresponding non-Provisional U.S. patent application Ser. No. 16/932,447 filed 17 Jul. 2020, having the same title as its related provisional application and filed on the same date as this application the disclosures of which are hereby incorporated herein by reference.

This application is also related to the technology disclosed in U.S. Provisional Patent Application Ser. No. 63/904,052, filed 23 Sep. 2019 and entitled "Enhanced Stability Oscillators using a Phononic Comb" and its corresponding non-Provisional U.S. patent application Ser. No. 16/932,455 filed 17 Jul. 2020, having the same title as its related provisional application and filed on the same date as this application the disclosures of which are hereby incorporated herein by reference.

This application is also related to the technology disclosed in U.S. Provisional Patent Application Ser. No. 63/083,619, filed 25 Sep. 2020 and entitled "Noise Suppression in a Phononic Comb", the disclosure of which are hereby incorporated herein by reference.

STATEMENT REGARDING FEDERALLY SPONSORED RESEARCH OR DEVELOPMENT

None.

TECHNICAL FIELD

Sensors utilizing a phononic comb for improved sensitivity.

BACKGROUND

Capacitive sensors are widely used in consumer electronics as well as industrial and defense applications. A common construction for a capacitive sensor consists of a capacitance element forming part of an RC or LC circuit. In the case of the RC circuit, changes in capacitance are observed by measuring the charging time required to reach a threshold voltage of a relaxation oscillator. In the case of an LC circuit, changes in capacitance are observed by measuring changes in the oscillator's frequency. The present invention is directed towards improvements to resonant or LC based capacitive sensors. Inductive sensors work in a similar manner by replacing externally sensitive capacitive elements with externally sensitive inductive ones. The present invention is also directed towards improvements to inductive sensors.

There are a variety of sensors which are capable of detecting objects in close proximity by measuring perturbations in the electric or magnetic fields generated by current carrying devices. These perturbations are typically observed by measuring changes in the electrical reactance (capacitance or inductance) at the terminals of the sensor. One method for observing this change in reactance of the sensor is to couple this sensor to an oscillator circuit, whose frequency of operation is varied by the varied reactance of the sensor. The sensitivity of resonant based proximity sensors is fundamentally limited by the system's ability to discern the smallest possible change in resonant frequency, which in turn is reliant on the quality factor (Q) of the resonator and the integration time of the sensing electronics.

This invention seeks to overcome this limitation by coupling a nonlinear MEMS resonator to the output of a resonant capacitive or inductive sensor. This nonlinear MEMS resonator is designed to generate a phononic frequency comb in response to the input signal applied by the sensor and may be embodied, for example, as a quartz piezoelectric resonator. The sensitivity of the sensor can be increased by isolating and measuring teeth in the comb which have a frequency shift relationship >1 relative to the drive frequency. In this way, the capacitive or inductive sensitivity of the sensor can be increased without requiring higher Q resonators, larger capacitive or inductive sensors elements, or longer integration times.

The prior art includes: Capacitive sensing, en.wikipedia.org/wiki/Capacitive sensing; Ganesan, Adarsh, Cuong Do, and Ashwin Seshia. "Excitation of coupled phononic frequency combs via two-mode parametric three-wave mixing," *Physical Review* B 97.1 (2018): 014302; and Park, Mingyo, and Azadeh Ansari. "Phononic frequency combs in stand-alone piezoelectric resonators." 2018 *IEEE International Frequency Control Symposium (IFCS)*; IEEE, 2018.

BRIEF DESCRIPTION OF THE INVENTION

Unlike the prior art sensors mentioned in the preceding paragraph, which are fundamentally limited in their ability to detect small capacitive or inductive changes by resonator quality factor and integration time, the presently disclosed technology teaches a method for improving sensitivity by coupling a phononic comb to the output of the sensor. By isolating teeth in the comb which have a frequency shift relationship >1 relative to the drive frequency, the effective frequency shift for a given change in capacitance or inductance can be enhanced without increasing the resonator quality factor (Q) or sensor integration time. The patent applications referenced above teach how to use a phononic frequency comb to enhance the sensitivity of gradiometers and/or other devices. The present disclosure teaches how to use a phononic frequency comb to enhance the sensitivity of a capacitive or inductive proximity sensor. The frequency shift induced by a capacitive or inductive sensor cannot be easily read out using a phase locked loop since the loop keeps adjusting the frequency/phase of the reference oscillator to match that of the capacitive/inductive sensor, so unlike the technology disclosed in some of the prior patent applications mentioned above, the technology taught herein teaches an apparatus and method using a fixed frequency reference. A phase locked loop can measure relative phase shifts but cannot measure an absolute or constant shift in phase or frequency, which is desirable to determine a change in capacitance or inductance.

The presently disclosed technology also teaches a method for further enhancing sensitivity by coupling a capacitive or inductive sensor to the body of host platform. This variation increases the effective size of the sensor and further increases the capacitive or inductive sensitivity of the device.

Additionally, the presently disclosed technology provides a method of remoting a phononic comb enhanced proximity sensor, by transmitting and receiving a narrowband phononic comb via a pair of antennas.

The presently disclosed technology provides a method and an apparatus for enhancing the sensitivity of an oscillator circuit functioning, in use, to sense changes in the inductance of inductive elements and/or the capacitance of capacitive elements coupled to said oscillator circuit. The oscillator circuit is coupled to a non-linear resonator for generating a comb of frequencies in response to a drive frequency generated by the oscillator circuit, the comb of frequencies having at least a portion of at least one tooth for which an absolute value of the first derivative of the drive frequency with respect to said comb frequency is less than 1.0, comparing an output of the non-linear resonator with an output of a reference oscillator for detecting changes in the drive signal of the oscillator circuit as enhanced by the slope of the at least a portion of at least one tooth for which the absolute value of the first derivative of the drive frequency with respect to said comb frequency is less than 1.0.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figure 1:
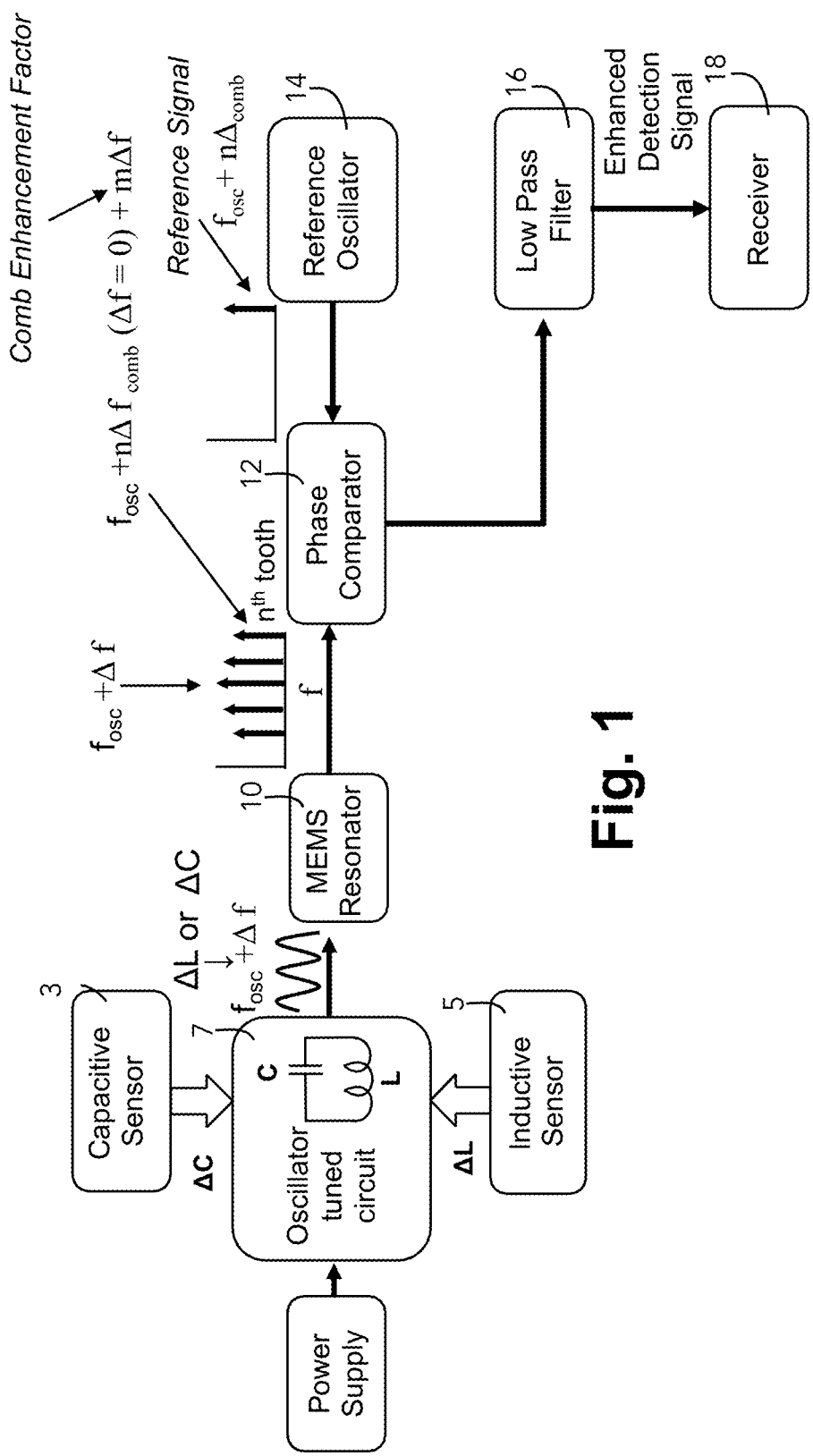
FIG. 1 is a diagram depicting one embodiment of the present invention.

FIG. 1 depicts one embodiment of the presently disclosed technology, which includes an externally sensitive capacitive sensor 3 or inductive sensor 5 coupled to a tuned oscillator circuit 7. In terms of practical applications, the capacitor of the capacitive sensor 5 could be part of a pressure sensor, temperature sensor, accelerometer, or gyro in which a physical force or thermal effect is detected by a change in the capacitance of plates or interdigitated structures in a capacitive sensor. These physical forces may be an inertial force, a Coriolis force, or a pressure force. Thus, this technique could be applied to a large number of sensors which use a shift in the resonant frequency of an oscillator circuit to detect a physical force or temperature change. The inductor of the inductive sensor could be part of a magnetometer, proximity or flow sensor. Thus, there are many applications for externally sensitive capacitive sensors 3 and inductive sensors 5 and this paragraph mentions but a few.

The tuned oscillator circuit 7 can be implemented by a variety of different oscillator architectures such as the Colpitts or Hartley oscillators and preferably includes a resonator. To enhance the sensitivity of this device and increase the frequency shift observed as a result of a change in capacitance or inductance, a nonlinear MEMS resonator 10 is coupled to the output of oscillator circuit 7 shown in FIG. 1. This nonlinear MEMS resonator 10 generates a phononic comb and can be embodied by any number of well-known electromechanical resonator designs such as, but not limited to, cantilever mode resonators, shear mode resonators, lamb mode resonator, bulk mode resonators, and surface acoustic wave resonators, exhibiting nonlinear behavior leading to the formation of phononic frequency combs. Phononic frequency combs have been previously observed in both AlN and Quartz resonators. See the articles by Ganesan et al. and Park et al. noted above. Also see the patent applications by Kubena et al. mentioned below.

Figure 2:
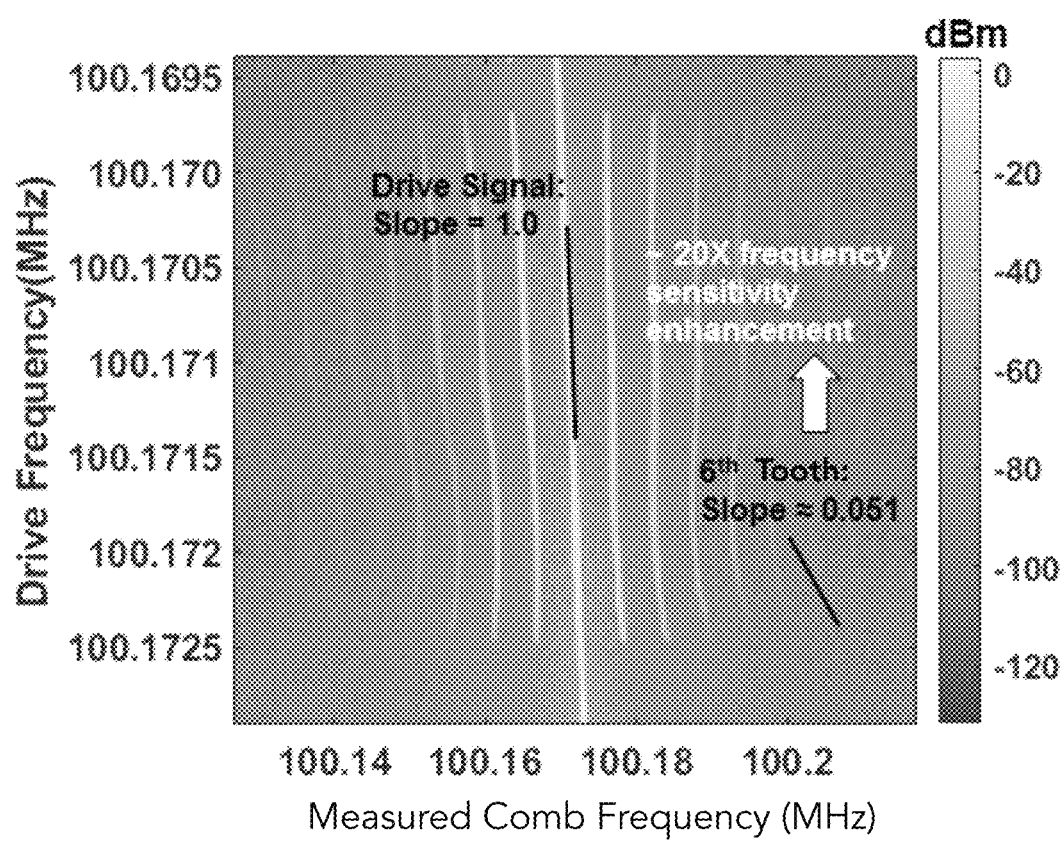
FIG. 2 shows measured data from a 100 MHz quartz shear mode resonator excited near 100.17 MHz at 16 dBm input power and 12° C. operating condition.

In U.S. patent application Ser. No. 16/932,431, entitled "Phononic Comb Enhanced Gradiometers" and filed 17 Jul. 2020 by Kubena et al. describes how certain teeth in phononic frequency combs have been observed to exhibit greater frequency shifts than the drive frequency which created the comb. FIG. 2 shows measured data from a 100 MHz quartz shear mode resonator excited near 100.17 MHz at 16 dBm input power and a 12° C. temperature operating condition. It can be observed from this data that a small frequency shift induced on the drive frequency can be enhanced on the 6th comb tooth by as much as 20×.

It should be borne in mind that in U.S. patent application Ser. No. 16/932,455, and entitled "Enhanced Stability Oscillators using a Phononic Comb" and filed 17 Jul. 2020 by Kubena et al. an object was to design an oscillator which has little (and ideally no) sensitivity to environment factors. On the other hand, U.S. patent application Ser. No. 16/932,447 entitled "Phononic Comb Enhanced MEMS Gravity Gradiometer" and filed 17 Jul. 2020 teaches how a phononic frequency comb can be utilized to increase sensitivity to environmental factors (and in that application, the environmental factor of interest was gravity).

The U.S. patent application Ser. No. 16/932,455, filed 17 Jul. 2020 by Kubena et al. suggests that an external phase locked loop may be used to reference an external oscillator to these more sensitive comb teeth thereby improving the sensitivity of magnetic or gravity gradiometer systems.

The nonlinear resonator 10 generates the phononic comb when driven sufficiently energetically and thus (additional) gain elements may be utilized between the oscillator tuned circuit 7 and the nonlinear resonator 10 to realize the phononic comb. For the purpose of this disclosure, it is assumed that oscillator tuned circuit 7 has sufficient gain to trigger the phononic comb in nonlinear resonator 10. Otherwise gain elements may be included between the oscillator tuned circuit 7 and the nonlinear resonator 10. Such gain elements are described in the related applications noted above. Also, as is described in U.S. Provisional Patent Application Ser. No. 63/083,619, filed 25 Sep. 2020 and entitled "Noise Suppression in a Phononic Comb", a bandpass filter may be utilized between the oscillator tuned circuit 7 and the nonlinear resonator 10 to reduce noise.

As disclosed herein, the sensitivity of capacitive and inductive sensors (see tuned circuit 7) can be increased by (i) using the output of conventional capacitive and inductive sensors to drive a nonlinear MEMS resonator 10 which can generate a phononic comb of frequencies and then referencing a sensitive tooth in the comb against a static (i.e., preferably without a phase locked loop at a receiver) reference waveform generated by a reference oscillator. As is shown in the embodiment of FIG. 1, the output of a nonlinear MEMS resonator 10 is a phononic comb of frequencies comprised of several equally spaced frequencies (i.e., a frequency comb of individual frequency teeth), which is electrically connected to a phase comparator 12. The nonlinear MEMS resonator 10 has a piezoelectric member preferably formed of quartz. The MEMS resonator 10 exhibits a non-linear response when driven sufficiently strongly by circuit 7. Circuit 7 may include or be connected with an amplifier (not shown) to cause MEMS resonator 10 to generate a frequency comb (that is, go non-linear). This phase comparator 12 can be comprised of any number of well-known circuit architectures such as a ring diode mixer. The phase comparator 12 is utilized to compare or in this case mix the phononic frequency comb from the nonlinear MEMS resonator 10 with a reference waveform or signal generated by a reference oscillator 14. This reference waveform may be generated by a single oscillator designed to output a single frequency at the approximate location of the most sensitive or, better yet, the most desirable tooth of the frequency comb output by nonlinear MEMS resonator 10. In embodiment of FIG. 1, the output of the phase comparator 12 is electrically connected to a low pass filter 16 which isolates the base band response and then a digital receiver 18 is used to observe the output signal. The digital receiver 18 may be implemented, for example, by a conventional Analog to Digital (A/D) Convertor. When the capacitance C and/or inductance L observed by the system increases, the frequency of the base band signal increases proportionally.

Selecting the most sensitive (or desirable) tooth of the frequency comb will be bit of a judgment call by the user. The user should use a comb tooth with the smallest slopes or regions of a comb tooth where the comb tooth has small slopes, the slope being defined as the first derivative of the drive frequency with respect to the tooth output frequency. It has been our observation that the slopes of the teeth change and the plots of teeth may become less linear as the number of the tooth increases (the tooth number being obtained by counting teeth as they increase in frequency to the right of the drive frequency on FIG. 2 or decrease in frequency to the left of the drive frequency on FIG. 2). Once one measures the phononic comb one can ascertain what the slope is of each tooth for all drive frequencies and then pick a tooth with an optimum slope at a desired drive frequency. But, as the number of a tooth increases (it moves frequency-wise more distant from the drive frequency), its signal to noise ratio (SNR) tends to deteriorate, so not only should the user pick a tooth with an optimum slope, but also one with a SNR acceptable to the user. So, a desirable tooth to utilize may not be the most sensitive tooth since there are multiple factors to consider in tooth selection. But the teeth having the lowest or smallest slopes (slopes less that 1.0) at a drive frequency of interest should be candidates for selection as the most desirable tooth. In FIG. 2, the drive signal has a slope of 1.0 while a region of the 6th tooth has a slope of 0.051 at a drive frequency of about 100.172 MHz.

The reader will note that the scales of the Drive Frequency is very narrow compared to the scale of the Measured Comb Frequency of FIG. 2, so a slope of 1.0 (for the drive frequency) is close to, but not quite, vertical in this graph. On either side of an infinite slope in FIG. 2, the slopes of the teeth can have either positive or negative values. Ideally the absolute value of the first derivative of the drive frequency with respect to the frequency of a tooth in the comb should have value less than 1 such as the slope marked as being 0.051 for a portion or point along the 6th tooth.

Figure 3:
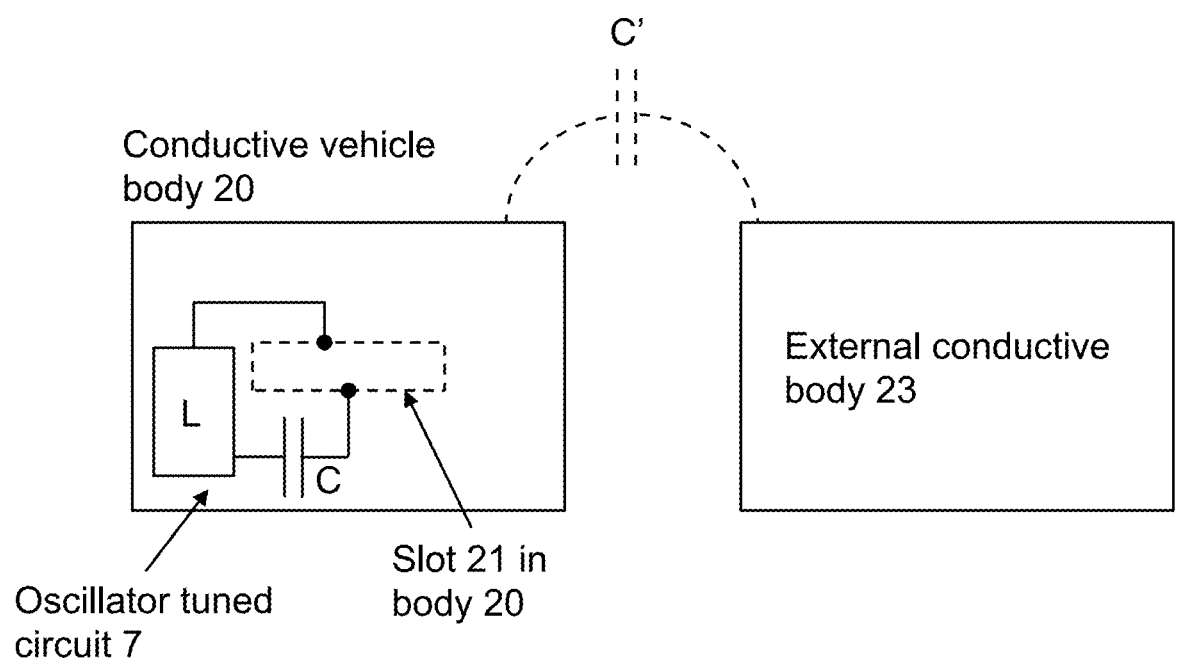
FIG. 3 depicts an embodiment where a sensor is installed in a vehicle and the vehicle itself forms a portion of the oscillator tuned circuit of the sensor of FIG. 1.

Another embodiment of the presently disclosed technology is to directly integrate a sensor (the oscillator tuned circuit 7) which may be relatively small in size compared with a much larger body, such as body 20 shown on FIG. 3. Body 20 may comprise an automobile chassis or body, an airplane body, a satellite body or the body of some other vehicle. The entirety of body 20 is part of the L or C of the oscillator's LC tuned circuit (see FIG. 3). Since the entire vehicle body 20 becomes a part of the sensor's electrode, the sensitivity of the sensor can be greatly improved especially for operation at VLF-HF frequencies. In this embodiment, one terminal of the capacitive and/or inductive element(s) is(are) electrically connected to the body 20 of the vehicle or alternatively the sensor may be placed in close proximity to the vehicle body 20. Ideally, the vehicle body 20 would be primarily comprised of conductive material.

The embodiment of body 20 depicted by FIG. 3 has a slot 21 therein and if the Phononic Comb Enhanced Capacitive Inductive Sensor of FIG. 1, for example, is implemented with a slot 21 in the body 20, the slot 21 being coupled with the inductor L and capacitor C of the oscillator tuned circuit 7 of FIG. 1 as depicted by FIG. 3, then the Phononic Comb Enhanced Capacitive Inductive Sensor can be utilized as a proximity sensor to sense the presence of an external conductive body 23 relative to the slot 21 since the external conductive body 23 will be sensed as having a capacitance C' with body 20. Of course, the body 20 may be equipped with multiple slots 21 each coupled with a separate oscillator tuned circuit 7 each of which is associated with a corresponding Phononic Comb Enhanced Capacitive Inductive Sensor of FIG. 1, for example, thereby providing body 20 (embodied as a vehicle, for example), with multiple proximity sensors.

Figure 4:
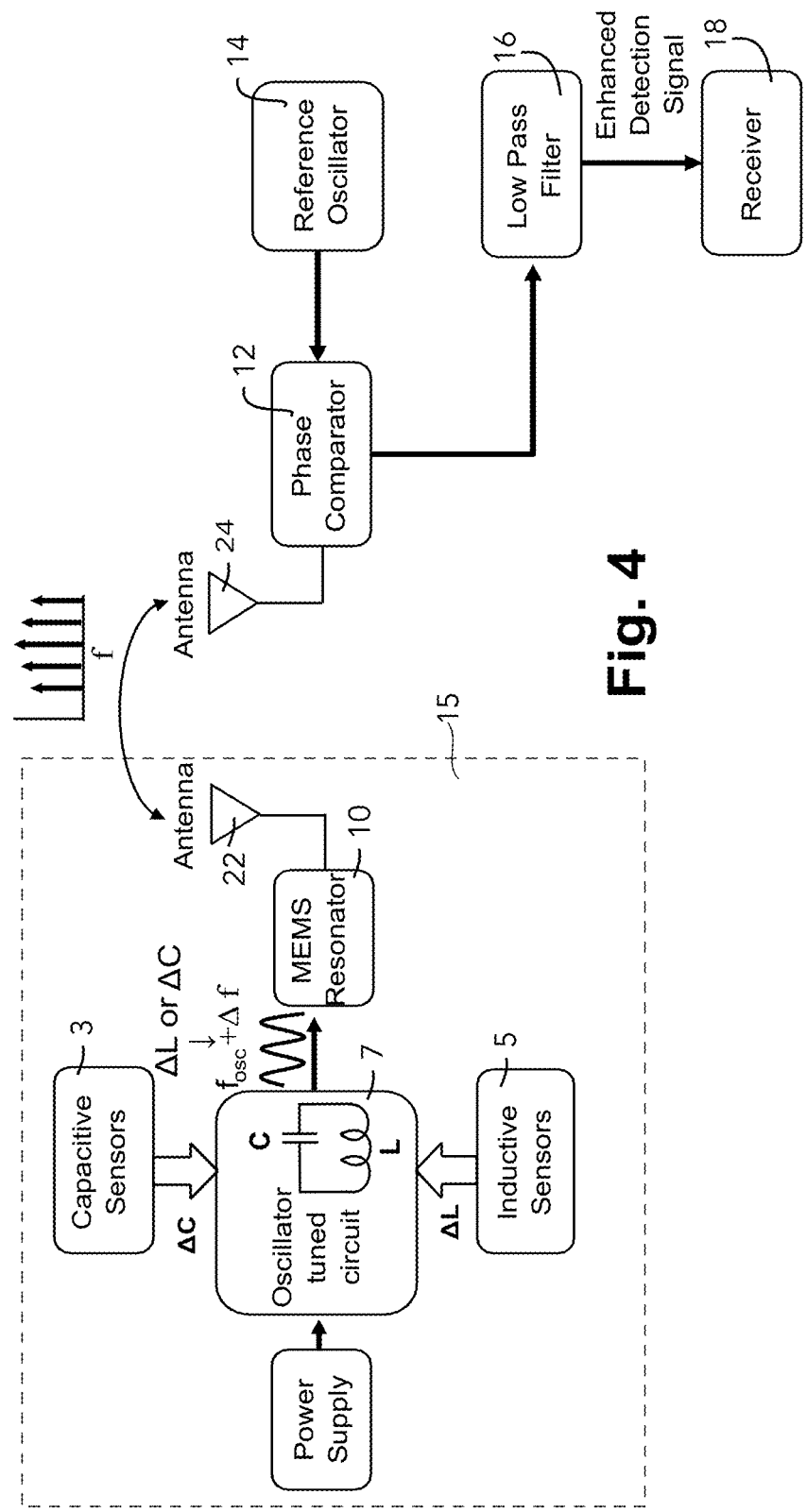
FIG. 4 depicts an embodiment where the sensor disclosed herein may be remoted at some distance from a receiver site.
Figure 5:
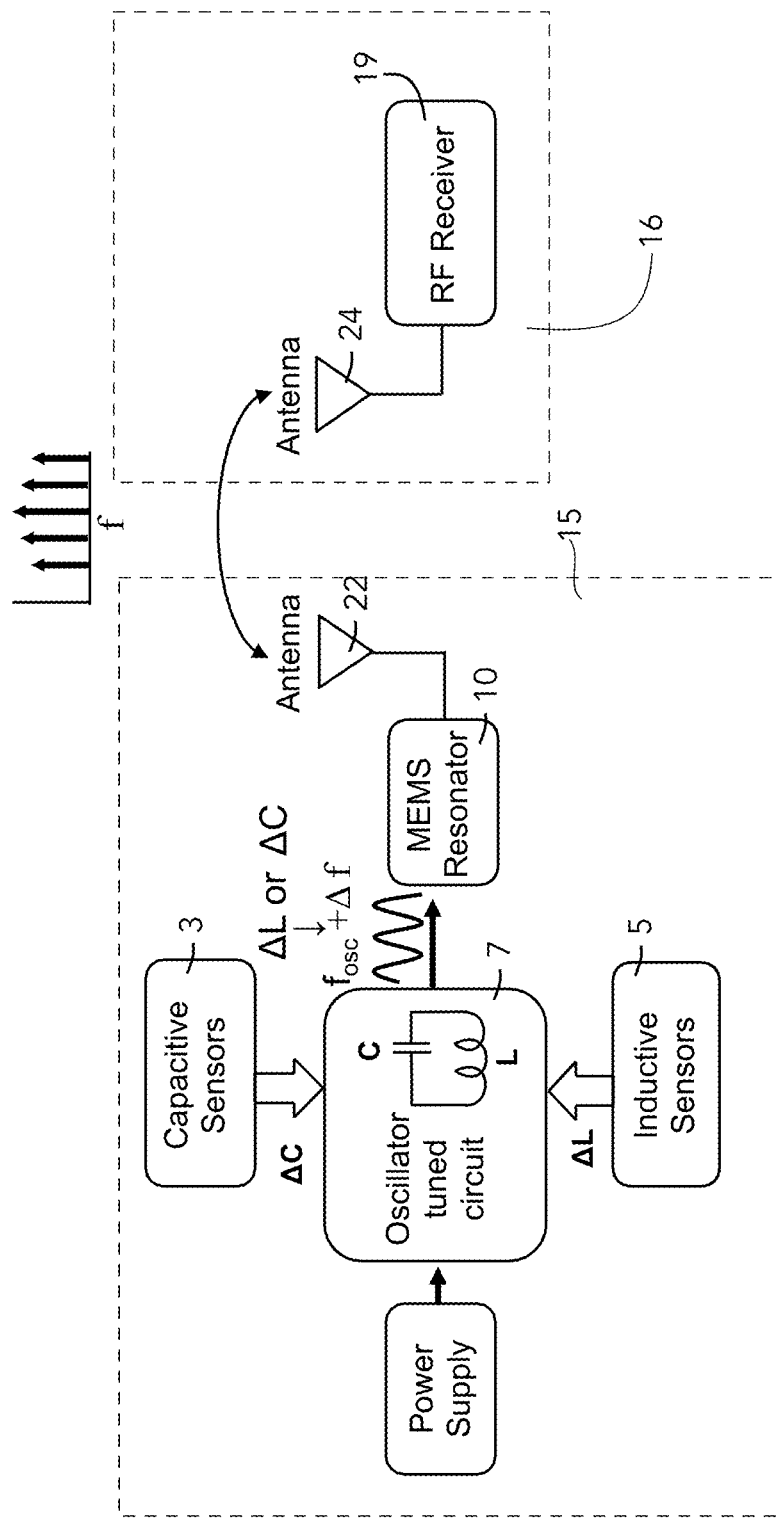
FIG. 5 depicts a modification of the embodiment of FIG. 4 where a digital receiver can replace some of the analog components of the embodiment of FIG. 4.

In the embodiment shown in FIG. 4, the output of the nonlinear MEMS device 10 is electrically connected to an antenna element 22. Due to the narrowband quality of the phononic frequency comb (<1% fractional bandwidth) this antenna element 22 can be particularly narrowband allowing its size and weight to remain small by using resonant matching. The phononic comb generated by the nonlinear MEMS device 10 is radiated wirelessly to a receiving antenna 24 which is located at a receiver site and is electrically connected to the phase comparator 12. As in the embodiment shown in FIG. 1, a reference oscillator 14, which is designed to generate a signal at the frequency of the most sensitive comb tooth, is compared with the received comb signal and the resultant baseband signal is measured using a conventional receiver 18 that may be embodied by a digital receiver or an A/D converter.

The embodiment of FIG. 4 enables the capacitive or inductive sensor 3, 5 of the tuned circuit 7 (see also FIG. 1) together with the nonlinear MEMS device 10 and antenna 22, which function together as a sensor transmitter 15, to be remotely located relative to the receiver site 16 (typically where antenna 24 is located) and thus the sensor 7 may be embedded in a variety of environments.

Figure 6A:
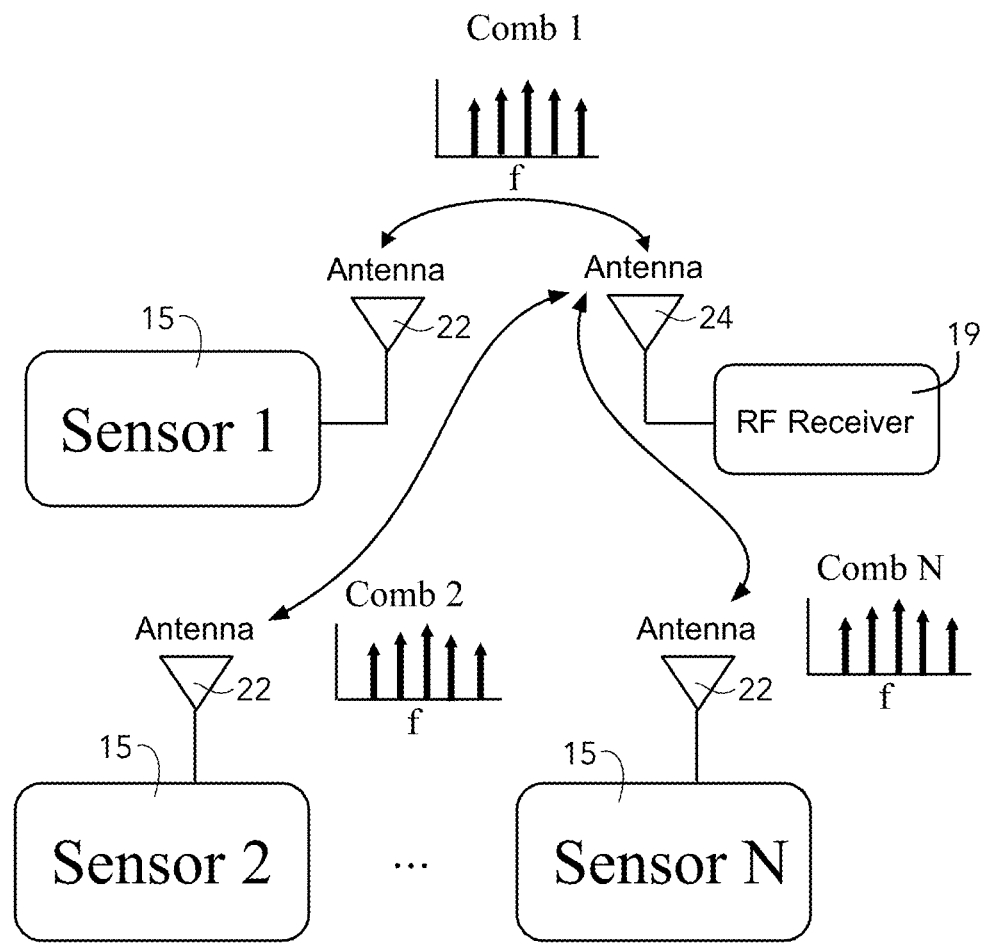
FIGS. 6A and 6B depict an embodiment where several sensors may be remotely located relative to a single receiver site, FIG. 6B showing the sensor transmitters in greater detail than shown in FIG. 6A.
Figure 6B:
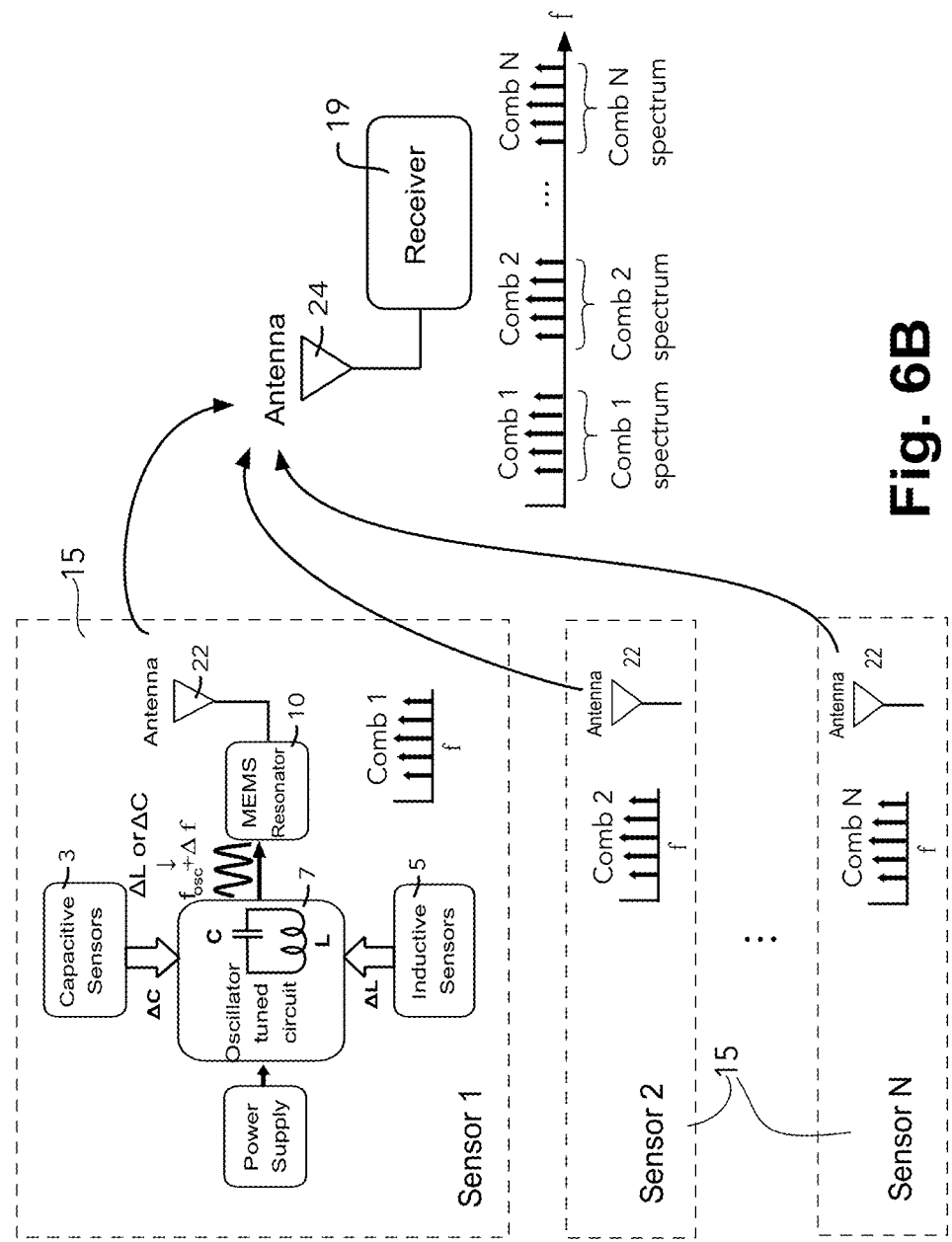
Figure 7:
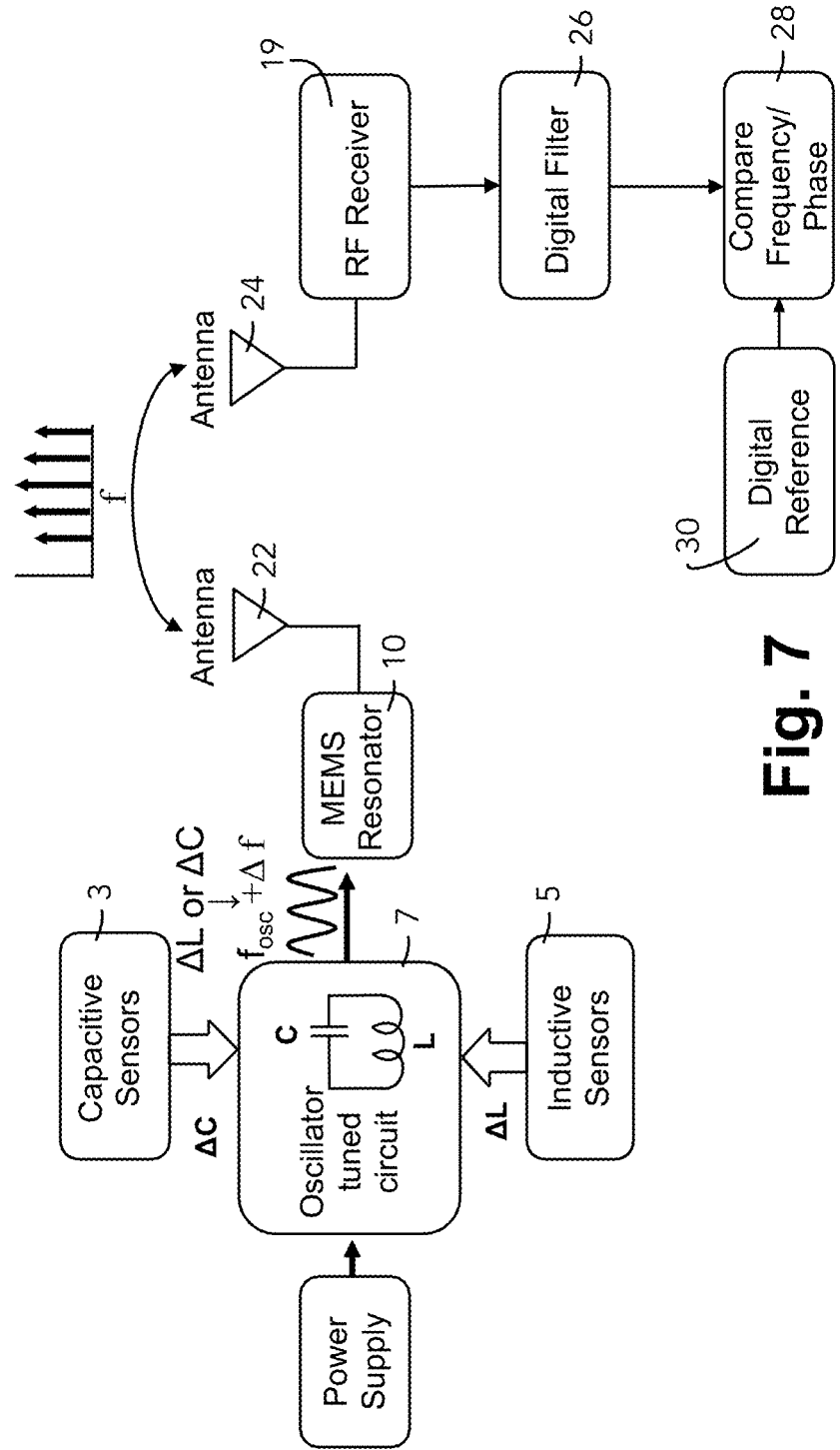
FIG. 7 depicts an embodiment with a digital filter at the remote receiver site.
Figure 8A:
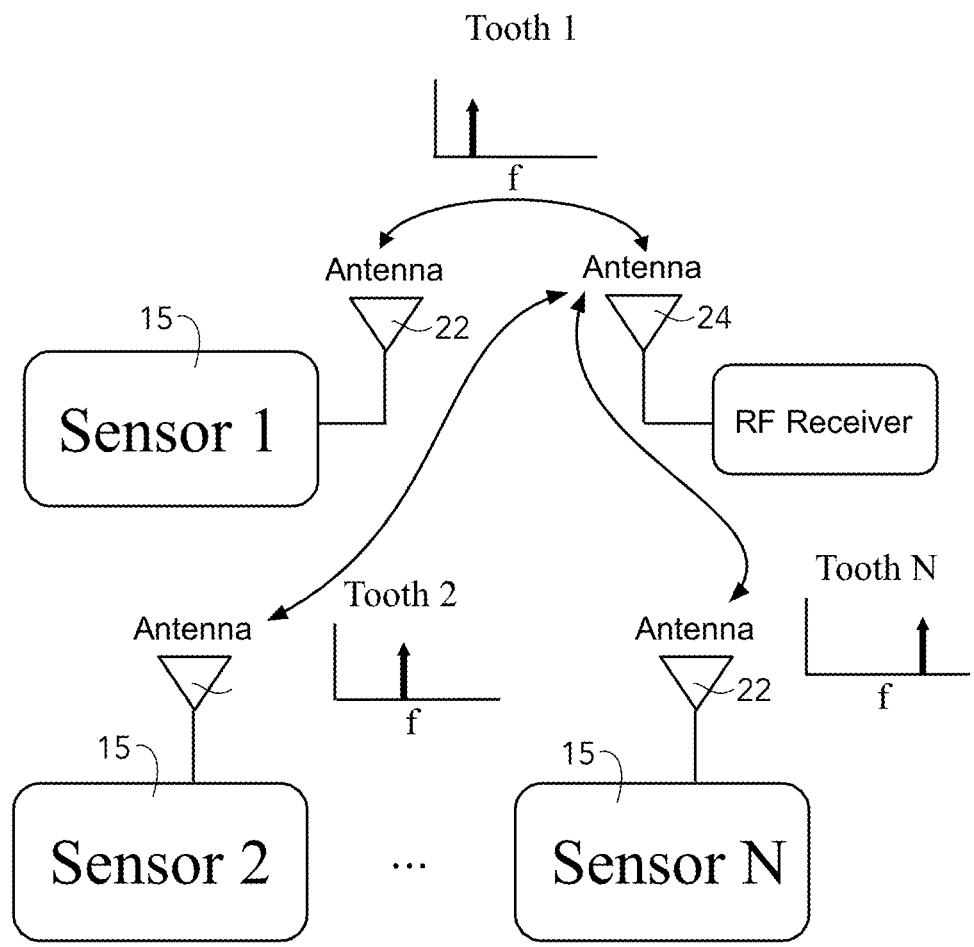
FIGS. 8A and 8B depict an embodiment where several sensors may be remotely located relative to a single receiver site similar to the embodiment of FIGS. 6A and 6B, but in this embodiment each sensor transmits a single tooth as opposed to a comb, FIG. 8B showing the sensor transmitters of this embodiment in greater detail than shown in FIG. 8A.
Figure 8B:
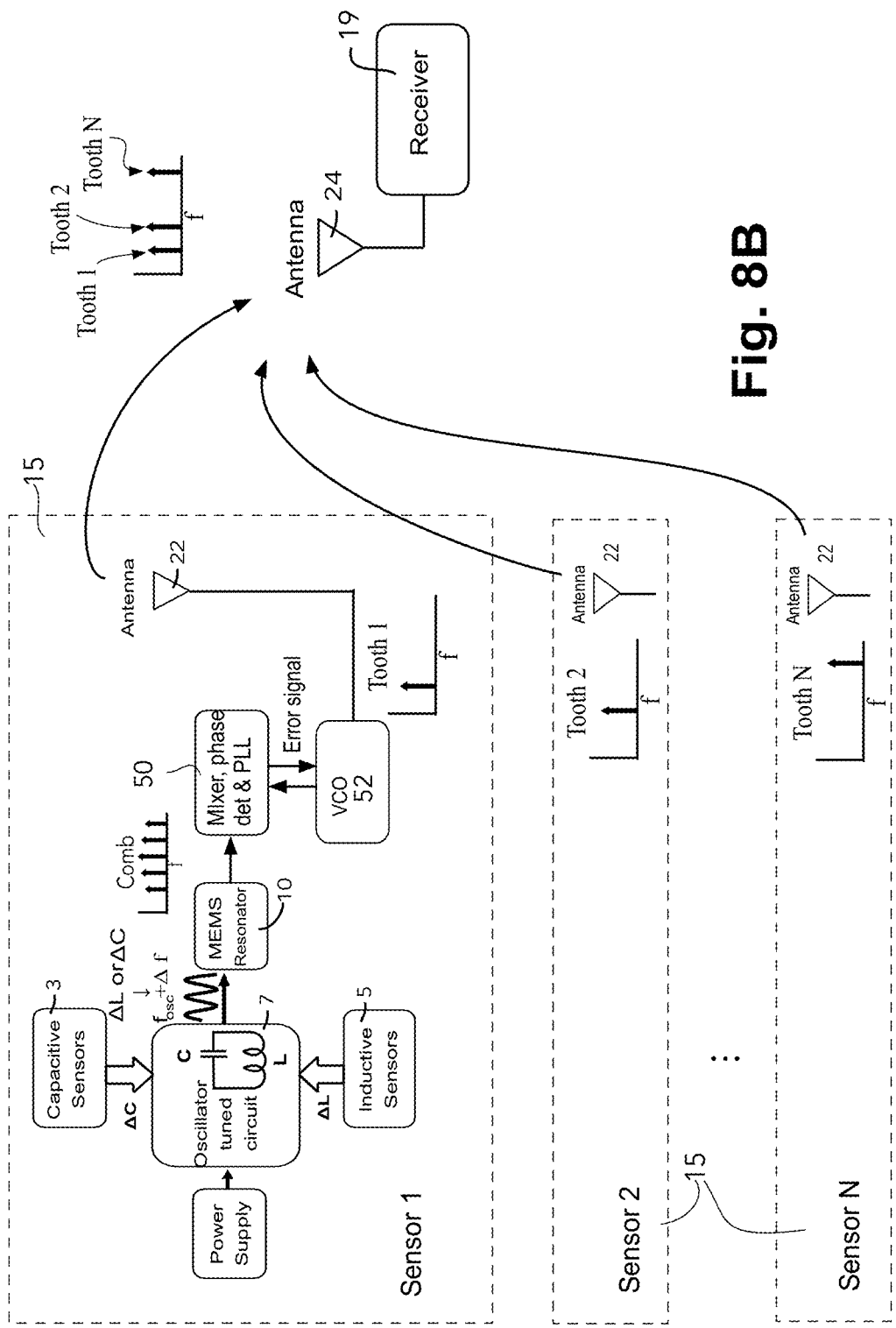

Turning now to FIGS. 5, 6A, 6B, 7, 8A and 8B, by remoting several sensors 7 each driven with slightly different frequencies as a plurality of N separate sensor transmitters 15, a wireless network (see FIGS. 6A and 6B or FIGS. 8A and 8B) of N capacitive or inductive sensors can be created where each sensor's output is identified by its output comb (see FIGS. 6A and 6B) or the tooth being transmitted (see FIGS. 8A and 8B). The transmitted frequency combs of the embodiment of FIGS. 6A and 6B occur at non-interfering frequencies or frequency spectrums and similarly the transmitted teeth of the embodiment of FIGS. 8A and 8B occur at frequencies that are sufficiently spaced so as to not interfere with each other.

In this embodiment of FIGS. 6A and 6B, a conventional RF receiver 19 (see FIG. 5), such as, but not limited to, a superheterodyne, direct conversion receiver, or an Analog to Digital (A/D) Converter, is utilized to receive the comb signals 1 . . . N via the receive antenna 24 (see FIGS. 5, 6A and 6B). Each sensor 15 in this embodiment transmits a frequency comb and the frequencies of the teeth of the transmitted combs are preferably selected to occupy a distinct comb band, as is shown in FIG. 6B, so that the comb spectrum from each sensor 15 may be used as a matched filter 26 at the receiver to demultiplex the signals from the different sensors 15. Alternatively, the frequencies of the teeth in each comb from the various sensors 15 may fall in a common band, but be sufficiently different from each other to allow differentiation from each other by the filter 26 at the receiver of FIG. 7.

Once received the combs are received, a series of matched filters 26 (see FIG. 7) may be utilized to de-interleave the comb signals 1 . . . N generated by each of the nonlinear MEMS resonators 10 associated with each of the N sensors, where the match filter identifying each sensor 15 is comprised of the comb waveform known to be output by a particular sensor 15. Once de-interleaved, the signal digital filtering can be used to isolate sensitive teeth with the comb and detect any frequency shifts due to changes in the capacitance or inductance of the sensor. The embodiment of FIG. 7 depicts a single element labeled filter 26, but if several sensors are employed as shown in FIGS. 6A and 6B, then the filter 26 of FIG. 7 may comprise a series of matched filters. The receiver 19 of FIG. 7 may be implemented as a direct conversion receiver using an A/D converter so all processing, including filtering, may be accomplished in the digital domain. Instead of being arranged as a direct conversion receiver, the apparatus of FIG. 7 may be modified to use a local oscillator (LO) and then operate instead as a superheterodyne receiver. The apparatus of FIG. 7 may also be modified to operate in the analog domain instead of the digital domain, if desired.

The digital reference signal generator 30 of FIG. 7 generates a digital reference signal corresponding to an anticipated frequency of the tooth being detected from filter 26 and phase detector 28 of FIG. 7 to detect how the phase of tooth from filter 26 is impacted by sensors 3 and/or 5. The digital filter 26, phase detector 28 and digital reference signal generator 30 may be embodied in the receiver 19 along with the aforementioned A/D converter, but are depicted here as separate elements merely for ease of explanation.

The embodiment of FIGS. 8A and 8B is different than the embodiment of FIGS. 6A and 6B in that each sensor 15 in this embodiment transmits a single tooth (as opposed to a comb of teeth), thereby simplifying the design of the aforementioned filter 26 shown in FIG. 7 and associated with receiver 19, but complicating the design of the sensor 15 of this embodiment in that additional electronics are needed to isolate the tooth to the transmitted. The additional electronics include, for example, a mixer, phase detector and PLL 50 and another resonator configured as a VCO 52. These additional electronics are described with reference to FIG. 4, for example, of U.S. Provisional Patent Application Ser. No. 63/083,619, filed 25 Sep. 2020 and entitled "Noise Suppression in a Phononic Comb" referenced above.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A sensor comprising:
   a tuned circuit producing a drive signal, a nonlinear resonator element responsive to the drive signal for generating a frequency comb having a plurality of teeth, a reference oscillator, and a phase detector circuit responsive to said frequency comb and said reference oscillator;
   wherein the tuned circuit is coupled to capacitive and/or inductive elements for affecting a frequency of the drive signal generated thereby,
   wherein the frequency comb generated by the nonlinear resonator element includes at least one portion or point of at least one selected tooth in said comb having a slope of less than 1.0 wherein the slopes exhibited by the teeth in the comb are defined by a first derivative of the drive frequency with respect to a frequency of the tooth at various drive frequencies;
   wherein the phase detector circuit compares the frequency comb generated by the nonlinear resonator element with an output of the reference oscillator, the reference oscillator generating a reference frequency selected to coincide with a frequency of the drive signal corresponding to where the that at least one portion or point of at least one selected tooth in said comb had said slope of less than 1.0.

2. An oscillator as claimed by claim 1 wherein nonlinear resonator element includes a piezoelectric quartz or AlN resonating member.

3. A method for enhancing the sensitivity of an oscillator circuit functioning, in use, to sense changes in the inductance of inductive elements and/or the capacitance of capacitive elements coupled to said oscillator circuit, the oscillator circuit coupled to a non-linear resonator for generating a comb of frequencies in response to a drive frequency generated by the oscillator circuit, the comb of frequencies having at least a portion or point of at least one tooth for which an absolute value of the first derivative of the drive frequency with respect to said comb frequency is less than 1.0, comparing an output of the non-linear resonator with an output of a reference oscillator for detecting changes in the drive signal of the oscillator circuit as enhanced by the slope of the at least a portion or point of at least one tooth for which the absolute value of the first derivative of the drive frequency with respect to said comb frequency is less than 1.0.

4. A method as claimed by claim 3 wherein the non-linear resonator member includes a piezoelectric quartz or AlN member.

5. A method as claimed by claim 3 wherein the oscillator is a voltage-controlled oscillator that includes a resonating member comprised of quartz or AlN.

6. In combination, a plurality of proximity sensors wirelessly connected with a remote receiver, each of the proximity sensors comprising a tuned circuit producing a drive signal and a nonlinear resonator element responsive to the drive signal for generating a frequency comb having a plurality of teeth, wherein the tuned circuit is coupled with capacitive and/or inductive sensing elements for affecting a frequency of the drive signal generated thereby in response to environmental elements affecting the proximity sensor in terms of a capacitance sensed by the capacitive sensing element and/or an inductance sensed by the inductance sensing element, each proximity sensor including circuitry for transmitting the frequency comb generated by its non-linear resonator to said remote receiver, the remote receiver receiving the transmitted frequency combs of the plurality of the proximity sensors and having one or more filters for differentiating the transmitted frequency combs of the plurality of proximity sensors from one another and for sensing a frequency change of at least one tooth in each transmitted frequency comb.

7. The combination of claim 6 wherein the frequency comb generated by the nonlinear resonator element of each sensor includes at least one portion or point of at least one selected tooth in said comb having a slope of less than 1.0 wherein the slopes exhibited by the teeth in the comb are defined by a first derivative of the drive frequency with respect to a frequency of the tooth at various drive frequencies.

8. The combination of claim 6 wherein each frequency comb of each proximity sensor comprises a different, non-interfering frequency spectrum so that the teeth received by the receiver from each of the plurality of proximity sensors occur at different frequencies.

9. In combination, a plurality of proximity sensors wirelessly connected with a remote receiver, each of the proximity sensors comprising a tuned circuit producing a drive signal and a nonlinear resonator element responsive to the drive signal for generating a frequency comb having a plurality of teeth, wherein the tuned circuit is coupled with capacitive and/or inductive sensing elements for affecting a frequency of the drive signal generated thereby in response to environmental elements affecting the proximity sensor in terms of a capacitance sensed by the capacitive sensing element and/or an inductance sensed by the inductance sensing element, each proximity sensor including circuitry for transmitting a selected tooth of the frequency comb generated by its a nonlinear resonator to said remote receiver, the remote receiver receiving the selected tooth transmitted by each of the plurality of proximity sensors and having one or more filters for differentiating the transmitted tooth of the plurality of proximity sensors from one another and for sensing a frequency change of transmitted tooth.

10. The combination of claim 9 wherein the frequency comb generated by the nonlinear resonator element of each proximity sensor includes at least one portion or point of at least one selected tooth in said comb having a slope of less than 1.0 wherein the slopes exhibited by the teeth in the comb are defined by a first derivative of the drive frequency with respect to a frequency of the tooth at various drive frequencies.

11. The combination of claim 9 wherein each transmitted tooth of each proximity sensor occupies a non-interfering frequency spectrum compared to the other teeth being transmitted so that the teeth received by the receiver from the plurality of proximity sensors occur at different, non-interfering frequencies.

* * * * *